US011758698B2

(12) United States Patent
Lee

(10) Patent No.: US 11,758,698 B2
(45) Date of Patent: Sep. 12, 2023

(54) POWER SEMICONDUCTOR COOLING MODULE FOR ELECTRIC VEHICLE

(71) Applicant: AMOGREENTECH CO., LTD., Gimpo-si (KR)

(72) Inventor: Hwan Ku Lee, Gimpo-si (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 123 days.

(21) Appl. No.: 17/433,057

(22) PCT Filed: Feb. 20, 2020

(86) PCT No.: PCT/KR2020/002445
§ 371 (c)(1),
(2) Date: Aug. 23, 2021

(87) PCT Pub. No.: WO2020/175848
PCT Pub. Date: Sep. 3, 2020

(65) Prior Publication Data
US 2022/0167525 A1    May 26, 2022

(30) Foreign Application Priority Data

Feb. 25, 2019   (KR) .................. 10-2019-0021786
Feb. 19, 2020   (KR) .................. 10-2020-0020269

(51) Int. Cl.
*H05K 7/20*     (2006.01)
*H05K 5/02*     (2006.01)

(52) U.S. Cl.
CPC ........... *H05K 7/209* (2013.01); *H05K 5/0217* (2013.01); *H05K 7/20854* (2013.01)

(58) Field of Classification Search
None
See application file for complete search history.

(56) References Cited

U.S. PATENT DOCUMENTS 8,503,180 B2 *   8/2013   Nojima ................. H02M 7/003
                                                         361/23
8,760,855 B2 *   6/2014   Howes ............... H05K 7/20936
                                                         361/677

(Continued)

FOREIGN PATENT DOCUMENTS

JP    2006-287112 A    10/2006
JP    2016-158358 A     9/2016

(Continued)

OTHER PUBLICATIONS

International Search Report Issued in PCT/KR2020/002445 dated Jun. 9, 2020, 2 pages.

*Primary Examiner* — Courtney L Smith
(74) *Attorney, Agent, or Firm* — Rothwell, Figg, Ernst & Manbeck, P.C.

(57) ABSTRACT

Provided is a power semiconductor cooling module for an electric vehicle. The power semiconductor cooling module for an electric vehicle, according to one exemplary embodiment of the present invention, is electrically connected to a motor and comprises: a box-shaped housing part having an inner space; a power element part disposed in the inner space and electrically connected to a motor via at least one busbar; a heat dissipation part disposed in the inner space so as to make contact with the power element part in order to cool heat generated from the power element part; and a heat backflow prevention member disposed so as to surround at least a portion of the total length of the busbar, and disposed so as to make contact with the heat dissipation part.

8 Claims, 5 Drawing Sheets

(56) References Cited

U.S. PATENT DOCUMENTS

| | | | |
|---|---|---|---|
| 10,135,356 B2* | 11/2018 | Takeuchi | H05K 7/20263 |
| 10,177,675 B2* | 1/2019 | Numakura | H02M 7/003 |
| 11,272,638 B2* | 3/2022 | Stoltz | H05K 7/20254 |
| 11,452,227 B2* | 9/2022 | Schmid | H02M 7/003 |
| 2012/0300521 A1* | 11/2012 | Hida | H05K 7/1432 |
| | | | 363/131 |
| 2013/0234636 A1* | 9/2013 | Savatski | H05K 7/1432 |
| | | | 318/400.26 |
| 2015/0156909 A1 | 6/2015 | Kwak et al. | |
| 2015/0311772 A1* | 10/2015 | Tominaga | H02K 13/02 |
| | | | 439/28 |
| 2016/0307822 A1* | 10/2016 | Usui | H01L 23/49562 |
| 2019/0326738 A1* | 10/2019 | Kita | H05K 1/02 |
| 2020/0013573 A1 | 1/2020 | Won et al. | |
| 2021/0284850 A1* | 9/2021 | Lee | C09D 7/69 |

FOREIGN PATENT DOCUMENTS

| | | |
|---|---|---|
| KR | 10-2015-0062663 A | 6/2015 |
| KR | 10-2015-0089100 A | 8/2015 |
| KR | 10-2018-0069747 A | 6/2018 |

* cited by examiner

POWER SEMICONDUCTOR COOLING MODULE FOR ELECTRIC VEHICLE

CROSS REFERENCE TO RELATED APPLICATIONS

This application is a 35 U.S.C. 371 National Phase Entry Application from PCT/KR2020/002445, filed Feb. 20, 2020, designating the United States, which claims the benefit of Korean Patent Application Nos. 10-2019-0021786 filed on Feb. 25, 2019 and 10-2020-0020269 filed on Feb. 19, 2020, the disclosures of which are incorporated herein in their entirety by reference.

TECHNICAL FIELD

The present invention relates to a power semiconductor cooling module for an electric vehicle.

BACKGROUND

Examples of environment-friendly vehicles include hybrid electric vehicles (HEVs), electric vehicles (EVs), and plug-in hybrid electric vehicles (PHEVs) obtained by combining the advantages of the two types of vehicles.

In these environment-friendly vehicles, a motor is driven by an alternating current (AC) three-phase voltage. Thus, the environment-friendly vehicles require an inverter that converts a direct current (DC) voltage supplied from a high voltage battery into an AC three-phase voltage for driving the motor and require a low DC-DC converter (LDC) for converting a high voltage into a low voltage of 12 V to supply the voltage of 12 V to vehicle components such as headlights, wipers, pumps, and control boards. These inverters and these LDCs may be collectively called a power converter.

Such a power converter includes a power control unit (PCU) or a power module (for example, an insulated gate bipolar transistor (IGBT) module) for controlling a high voltage (for example, 300 V) of a driving battery to a state suitable for the motor and supplying the voltage.

The power module includes power elements such as inverters, smoothing capacitors, and converters or power semiconductors that are power conversion devices. Since the power elements or the power semiconductors generate heat according to the supply of electricity, separate cooling units are always required.

In particular, cooling performance may be an important factor in the design of components such as the power semiconductors of the power converters. That is, when these components are continuously heated, performance thereof is degraded, and in severe cases, the components are damaged, and when the cooling performance is degraded, the durability of the components is also reduced accordingly.

Such a power module is electrically connected to the motor through a bus bar. In general, the bus bar is made of copper, and the copper has both electrical conductivity and thermal conductivity due to the characteristics of the material. Accordingly, there is a problem in that the heat generated when the motor is driven is refluxed toward the power module through the bus bar, and thus the performance of the power module is degraded due to the heat refluxed through the bus bar.

SUMMARY OF THE INVENTION

The present invention is directed to providing a power semiconductor cooling module for an electric vehicle that may solve a problem that heat is refluxed from a motor to a power element part through a bus bar.

One aspect of the present invention provides a power semiconductor cooling module for an electric vehicle, which is electrically connected to a motor, including: a housing part formed in a box shape having an internal space; a power element part disposed in the internal space and electrically connected to the motor through at least one bus bar; a heat dissipation part disposed in the internal space to be in contact with the power element part and configured to cool heat generated by the power element part; and a heat reflux prevention member disposed to surround at least a part of the entire length of the bus bar and disposed to be in contact with the heat dissipation part.

The heat dissipation part may include a heat sink disposed to be in contact with the power element part and a cooling unit for cooling the heat sink.

The heat sink may include a heat radiation plate formed in a plate shape having a predetermined area and a plurality of heat radiation fins protruding from one surface of the heat radiation plate.

The cooling unit may include an accommodation groove recessed from one surface of a body by a predetermined depth so that the heat sink is accommodated therein, and an edge of the heat sink may be in direct contact with the body in a state in which the heat sink is inserted into the accommodation groove.

The cooling unit may include a body in which a cooling water supplied from the outside is accommodated therein and an inlet and an outlet provided on one side of the body so that the cooling water is introduced or discharged through the inlet or the outlet, and the heat sink may be cooled through heat exchange with the cooling water.

The heat reflux prevention member may be disposed so that at least one surface thereof is in surface contact with one surface of the cooling unit and may be directly cooled by the cooling unit.

The heat reflux prevention member may be made of a plastic material having heat radiation properties and insulation properties.

A heat transfer material may be interposed between one surface of the heat reflux prevention member and one surface of the cooling unit facing each other.

The bus bar may include a first end electrically connected to the power element part and a second end exposed to the outside through a through-hole of the housing part, and the heat reflux prevention member may be disposed to be located between the first end and the second end. The heat reflux prevention member may block heat from being moved from the first end toward the second end through heat exchange with the heat dissipation part.

According to the present invention, even when heat generated from a motor is refluxed toward a power element part through a bus bar, the refluxed heat can be transferred to a cooling unit through a heat reflux prevention member. As a result, the power element part is prevented from overheating due to the heat refluxed from the motor, and thus performance degradation of the power element part due to the refluxed heat can be prevented.

DETAILED DESCRIPTION OF THE INVENTION

Figure 1:
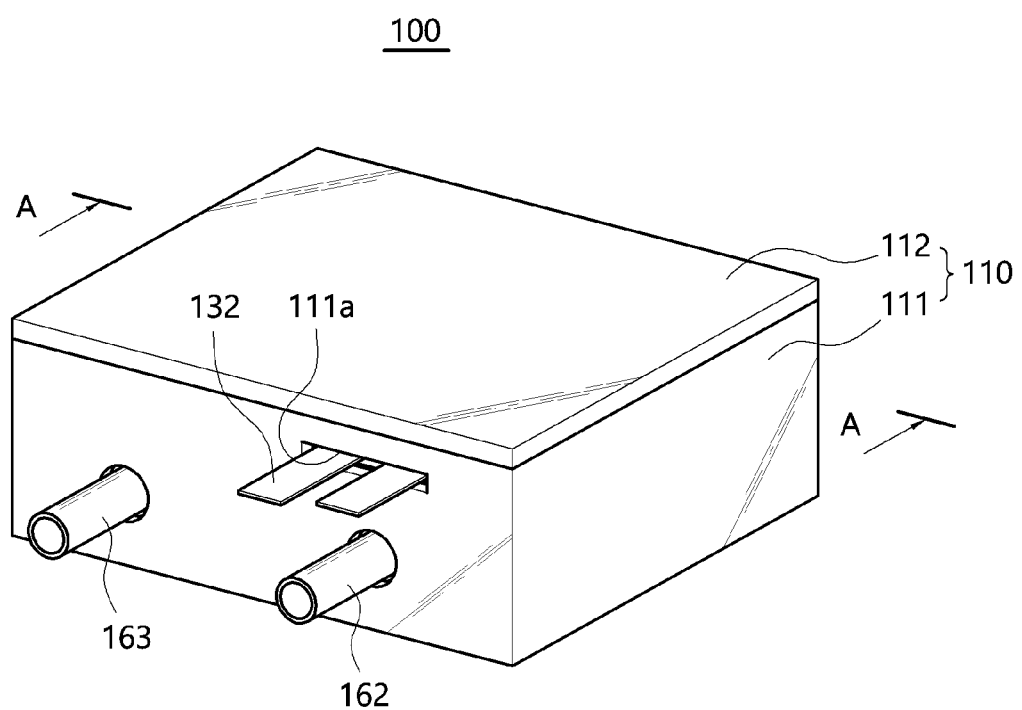
FIG. 1 is a view showing a power semiconductor cooling module for an electric vehicle according to one embodiment of the present invention.

Hereinafter, embodiments of the present invention will be described in detail with reference to the accompanying drawings so that those skilled in the art to which the present invention pertains may easily implement the present invention. The present invention may be implemented in various different forms and is not limited to the embodiments described herein. In the drawings, parts irrelevant to the description are omitted in order to clearly describe the present invention, and the same or similar reference numerals are assigned to the same or similar components throughout the specification.

Figure 2:
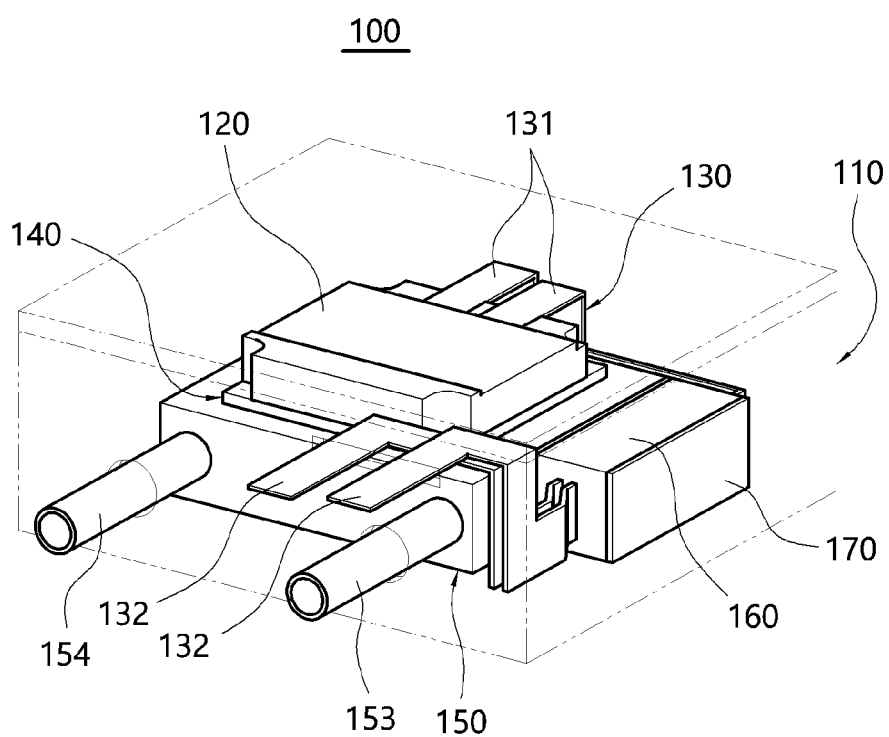
FIG. 2 is a view showing a state in which a housing is removed from that in FIG. 1.
Figure 3:
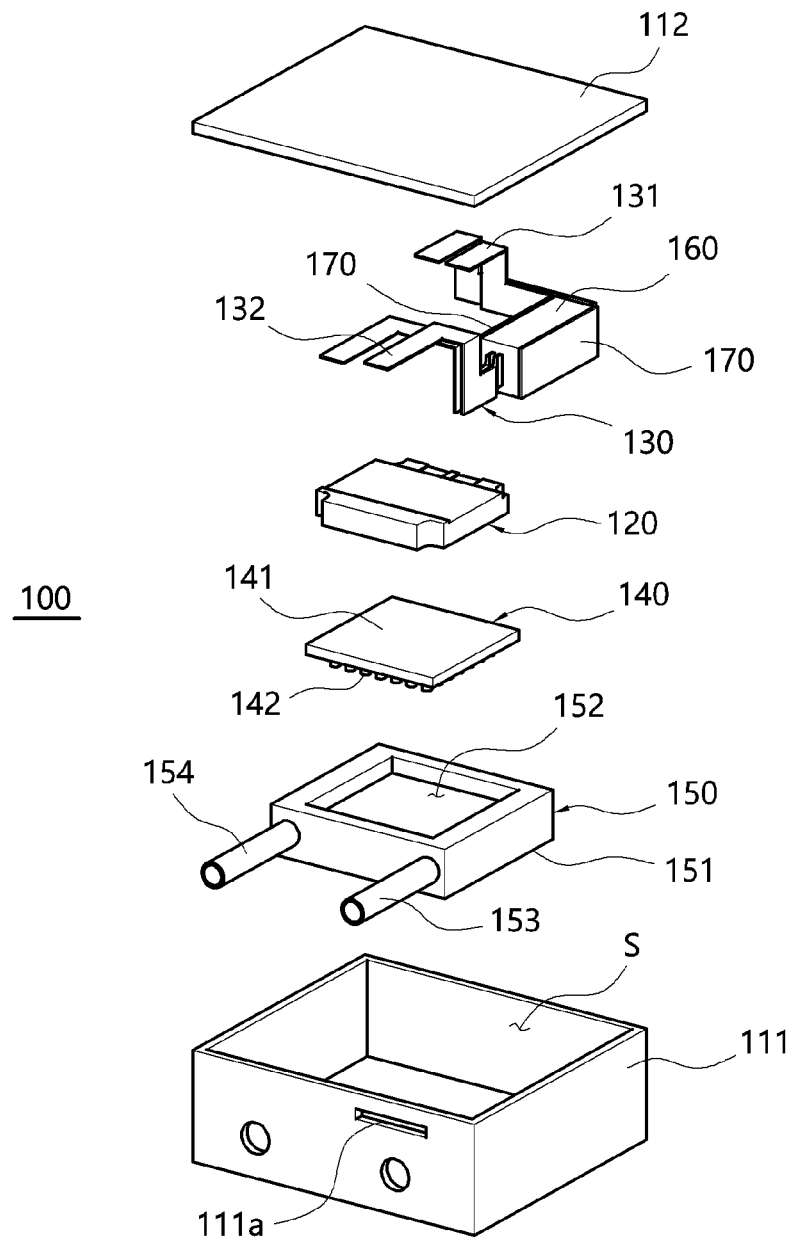
FIG. 3 is an exploded diagram of FIG. 1.

As shown in FIGS. 1 to 3, a power semiconductor cooling module 100 for an electric vehicle according to one embodiment of the present invention includes a housing part 110, a power element part 120, heat dissipation parts 140 and 150, and a heat reflux prevention member 160.

The housing part 110 may be formed in a box shape having an internal space S. As a result, the housing part 110 may accommodate, in the internal space S, the power element part 120, the heat dissipation parts 140 and 150, the heat reflux prevention member 160, and the like.

As an example, the housing part 110 may include a case 111 formed in a box shape having the internal space S with an open upper portion and a cover plate 112 that covers the open upper portion of the case 111.

In this case, the housing part 110 may be made of a material having heat radiation properties.

As an example, the housing part 110 may be made of a metal material such as aluminum. However, the material of the housing part 110 is not limited thereto, and the housing part 110 may be made of various widely known materials as long as the materials have heat radiation properties. That is, the housing part 110 may be made of a widely known heat radiation plastic material having the heat radiation properties as well as the metal material and may be configured in a form in which the metal material and the heat radiation plastic material are combined.

The power element part 120 may include a widely-known insulated gate bipolar transistor (IGBT) and may include a power element such as an inverter, a smoothing capacitor, and a converter or a power semiconductor that is a power conversion device. Further, the power element part 120 may serve to change a voltage for driving a motor.

Since the power element part 120 is commonly applied to environment-friendly vehicles including hybrid electric vehicles (HEVs), electric vehicles (EVs), and plug-in hybrid electric vehicles (PHEVs), a detailed description thereof will be omitted.

In this case, the power element part 120 may be electrically connected to the motor (not shown) for driving the environment-friendly vehicle through at least one bus bar 130.

Figure 4:
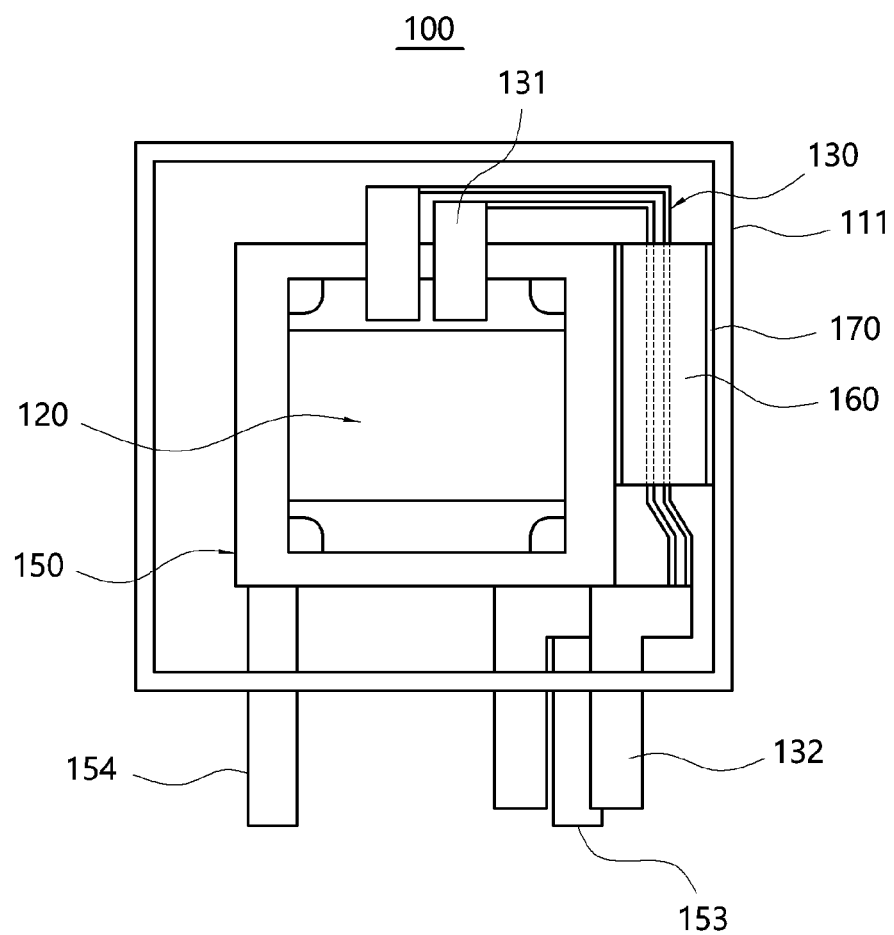
FIG. 4 is a plan view showing a state in which a cover plate is removed from that in FIG. 1.

That is, as shown in FIGS. 2 to 4, the bus bar 130 may have one end connected to the power element part 120 and the other end exposed to the outside of the housing part 110.

In detail, the at least one bus bar 130 may be formed as a plate-shaped member having a predetermined length and have a shape bent once or more.

In a state of being disposed in the internal space S of the housing part 110, one end of the bus bar 130 may be connected to the power element part 120 and the other end of the bus bar 130 may be exposed to the outside of the housing part 110.

As an example, the bus bar 130 may be a plate-shaped member having a predetermined length and including a first end 131 and a second end 132.

In this case, the first end 131 may be connected to the power element part 120, and the second end 132 may be exposed to the outside through a through-hole 111a formed through one side of the case 111.

Here, the bus bar 130 may be made of a conductive material to electrically connect the power element part 120 and the motor. As an example, the bus bar 130 may be made of a metal material including copper, aluminum, or the like.

The heat dissipation parts 140 and 150 may be disposed in the internal space S to be in contact with the power element part 120.

The heat dissipation parts 140 and 150 may receive and cool heat generated by the power element part 120 when the power element part 120 is operated.

As an example, the heat dissipation parts 140 and 150 may include a heat sink 140 and a cooling unit 150.

The heat sink 140 may receive the heat generated by the power element part 120 when the power element part 120 is operated and discharge the heat to the outside or transfer the heat to another component.

To this end, the heat sink 140 may be made of a metal material having excellent thermal conductivity. As a non-limiting example, the heat sink 140 may be made of a metal material including aluminum having excellent thermal conductivity while the overall weight is reduced. However, the material of the heat sink 140 is not limited thereto, and the heat sink 140 may be made of a material without limitation as long as the material has excellent heat radiation properties and/or thermal conductivity.

In this case, the heat sink 140 may be disposed in the internal space S so that at least a part thereof is in contact with the power element part 120. As an example, one surface of the heat sink 140 may be in surface contact with one surface of the power element part 120.

In detail, the heat sink 140 may include a heat radiation plate 141 formed in a plate shape having a predetermined area, and an upper surface of the heat radiation plate 141 may be in surface contact with a lower surface of the power element part 120.

Accordingly, since the heat radiation plate 141 is in surface contact with the power element part 120, a heat exchange area is increased, and thus the heat generated by the power element part 120 may be smoothly transferred.

In this case, the heat sink 140 may further include at least one heat radiation fin 142 to increase the heat exchange area, thereby improving the heat radiation properties. That is, as shown in FIG. 3, the heat sink 140 may include a plurality of heat radiation fins 142 protruding from one surface of the heat radiation plate 141 by a predetermined length.

The cooling unit 150 may forcibly cool the heat generated by the power element part 120 and then transferred toward the heat sink 140. As a result, the cooling unit 150 may quickly cool the heat transferred to the heat sink 140 so as to maintain the temperature of the power element part 120 at an appropriate temperature.

That is, the cooling unit 150 may forcibly reduce the temperature of the heat sink 140 disposed in contact with the one surface of the power element part 120, thereby cooling the power element part 120.

To this end, at least a portion of the cooling unit 150 may be disposed in contact with the heat sink 140, and the cooling unit 150 may quickly cool the heat transferred from the power element part 120 to the heat sink 140 using cooling water supplied from the outside.

In detail, the cooling unit 150 may include a body 151 in which the cooling water supplied from the outside is accommodated therein and an inlet 153 and an outlet 154 provided on one side of the body 151 so that the cooling water may be introduced or discharged through the inlet 153 or the outlet 154.

In this case, the inlet 153 and the outlet 154 may be disposed to be exposed to the outside of the housing part 110.

As a result, the cooling water supplied from the outside to the inside of the body 151 may cool the heat sink 140 through heat exchange with the heat sink 140, and the heat generated by the power element part 120 may be quickly transferred to the heat sink 140 cooled through the cooling water. As a result, the power element part 120 may maintain an appropriate temperature even when the heat is generated during operation.

Here, the body 151 may have a plurality of channels (not shown) formed therein so that the cooling water supplied through the inlet 153 may flow in a zigzag manner, but the present invention is not limited thereto, and the body 15 may be formed as one space.

In this case, the cooling unit 150 may include an accommodation groove 152 so that a contact area with the heat sink 140 is widened while the heat sink 140 is accommodated therein. That is, the accommodation groove 152 may be recessed from one surface of the body 151 by a predetermined depth.

As an example, as shown in FIG. 3, the body 151 may include the accommodation groove 152 that is recessed and formed inward from the upper surface thereof by a predetermined depth, and the accommodation groove 152 may have substantially the same size as the heat sink 140.

As a result, the heat sink 140 may be inserted into the accommodation groove 152, and at least a portion of the heat sink 140 may be in direct contact with the body 151 in a state in which the heat sink 140 is inserted into the accommodation groove 152.

Figure 5:
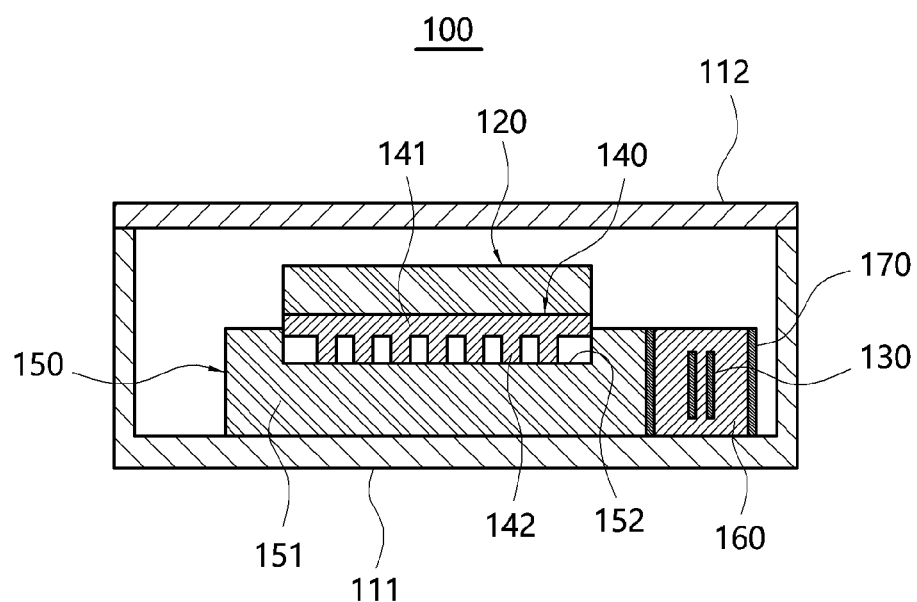
FIG. 5 is a sectional view taken along line A-A of FIG. 1.

As a non-limiting example, as shown in FIGS. 4 and 5, the heat sink 140 may be inserted into the accommodation groove 152 so that an edge side of the heat radiation plate 141 is in direct contact with the body 151.

Accordingly, since a heat exchange area between the sink 140 and the cooling unit 150 may be increased, the heat sink 140 may quickly dissipate the heat through the heat exchange with the cooling water.

The heat reflux prevention member 160 may prevent the refluxed heat from affecting the power element part 120 even when the heat generated by the motor is refluxed to the power element part 120 through the bus bar 130 having thermal conductivity.

That is, the heat reflux prevention member 160 may guide the heat refluxed from the motor through the bus bar 130 so that the heat is transferred to the cooling unit 150. As a result, the heat reflux prevention member 160 may block the heat refluxed from the motor from being transferred to the power element part 120 and thus may prevent performance degradation and damage of the power element part 120 due to the heat.

Accordingly, as described above, the heat generated by the power element part 120 when the power element part 120 is operated may be transferred toward the heat sink 140 and then cooled through the cooling unit 150, and the heat refluxed from the motor through the bus bar 130 may be guided toward the cooling unit 150 through the heat reflux prevention member 160 and then cooled.

As a result, the power element part 120 may maintain a set appropriate temperature, thereby preventing the performance degradation and damage of the power element part 120 due to the heat.

To this end, the heat reflux prevention member 160 may be disposed to surround at least a portion of the entire length of the bus bar 130, and at least a portion of the heat reflux prevention member 160 may be disposed in the internal space S to be in contact with the cooling unit 150.

Here, the heat reflux prevention member 160 may be disposed to surround the entire length of the bus bar 130 disposed in the internal space S or may be disposed to surround only a part of the entire length disposed in the internal space S.

In detail, the heat reflux prevention member 160 may be disposed to surround the remaining length excluding the first end 131 and the second end 132 of the entire length of the bus bar 130 and may be disposed to be located between the first end 131 and the second end 132.

In addition, the heat reflux prevention member 160 may be disposed to be in direct contact with the cooling unit 150 among the heat dissipation parts 140 and 150, and the heat reflux prevention member 160 may be disposed so that one surface thereof is in surface contact with the one surface of the body 151 constituting the cooling unit 150 to widen the heat exchange area.

Accordingly, even when the heat is refluxed from the motor to the bus bar 130, the heat refluxed to the bus bar 130 may be moved to the cooling unit 150 through the heat reflux prevention member 160 and then cooled. As a result, the heat reflux prevention member 160 may block the heat refluxed from the motor from being transferred to the power element part 120.

In this case, the heat reflux prevention member 160 may be made of a material having heat radiation properties and insulation properties to smoothly transfer, toward the cooling unit 150, the heat refluxed from the motor toward the bus bar 130 even while preventing electrical short circuit between the bus bar 130 and the cooling unit 150.

As an example, the heat reflux prevention member 160 may be formed of a plastic material having heat radiation properties and insulation properties. As a result, the heat refluxed through the bus bar 130 may be transferred toward the cooling unit 150 and then cooled quickly.

Accordingly, in the power semiconductor cooling module 100 for an electric vehicle according to one embodiment of the present invention, even when the heat is refluxed from the motor through the bus bar 130, the heat may be smoothly transferred to the cooling unit 150 through the heat reflux prevention member 160 made of a plastic material having heat radiation properties and insulation properties and then may be quickly dissipated through the cooling water supplied to the cooling unit 150.

This may be identified from Table 1.

An example corresponds to temperatures measured at positions corresponding to the first end 131 and the second end 132 of the bus bar 130 in the power semiconductor cooling module 100 for an electric vehicle as shown in FIGS. 1 to 5, and a comparative example corresponds to temperatures measured at positions corresponding to the first end 131 and the second end 132 of the bus bar 130 in a general power semiconductor cooling module for an electric vehicle from which a heat reflux prevention member is removed in the above example. Further, in the example, the heat reflux prevention member 160 is made of a material having a thermal conductivity of 3 W/m·K, and the temperature of the cooling water introduced into the cooling unit 150 is 25° C.

TABLE 1

Temperature of bus bar for each location

| Classification | Temperature of first end of bus bar (° C.) | Temperature of bus bar at position at which heat reflux prevention member is molded | Temperature of second end of bus bar (° C.) |
|---|---|---|---|
| Example | 54.7 | 57.2 | 120 |
| Comparative example | 67.1 | 86.6 | 120 |

As can be seen in Table 1 above, in the power semiconductor cooling module 100 for an electric vehicle according to one embodiment of the present invention, it can be identified that the temperature of the second end 132 connected to the motor is the same as that of the comparative example, but the temperature of the first end 131 connected to the power element part 120 is lower than that of the comparative example by 12.4° C.

Further, the temperature of the bus bar 130 in a portion in which the heat reflux prevention member 160 is installed is lower in the example than in the comparative example by 29.4° C.

From the above results, in the case of the embodiment, it may mean that even when the heat is refluxed from the second end 132 toward the first end 131, the refluxed heat is transferred to the cooling unit 150 through the heat reflux prevention member 160 while moving toward the first end 131 and is cooled.

As a result, in the power semiconductor cooling module 100 for an electric vehicle according to one embodiment of the present invention, even when the heat is refluxed from the motor through the bus bar 130, the refluxed heat is cooled through the cooling unit 150, and thus the amount of heat refluxed to the power element part 120 is insignificant, or the heat may be lost by being guided toward the cooling unit 150 through the heat reflux prevention member 160.

For this reason, in the power semiconductor cooling module 100 for an electric vehicle according to one embodiment of the present invention, even when the heat generated from the motor is refluxed toward the power element part 120 through the bus bar 130 having thermal conductivity, the influence of the refluxed heat on the power element part 120 can be minimized.

As a result, in the power semiconductor cooling module 100 for an electric vehicle according to one embodiment of the present invention, even when the heat generated from the motor is refluxed toward the power element part 120 through the bus bar 130, thermal damage and performance degradation of the power element part 120 due to the refluxed heat can be prevented.

Meanwhile, the heat reflux prevention member 160, which is applied to the power semiconductor cooling module 100 for an electric vehicle according to one embodiment of the present invention, may be an injection product formed of a resin-forming composition having heat radiation properties and insulation properties and may be formed integrally with the bus bar 130 through insert molding.

As a non-limiting example, the heat reflux prevention member 160 may be made of a plastic having heat radiation properties and insulation properties and may be in the form in which an insulation heat radiation filler is dispersed in a polymer matrix.

Here, the polymer matrix may be used without limitation when the polymer matrix is implemented with a polymer compound that may be injection-molded without impairing the dispersibility of the heat radiation filler. As a specific example, the polymer matrix may be a widely known thermoplastic polymer compound, and the thermoplastic polymer compound may be one kind of compound selected from the group consisting of polyamide, polyester, polyketone, liquid crystal polymer, polyolefin, polyphenylene sulfide (PPS), polyether ether ketone (PEEK), polyphenylene oxide (PPO), polyether sulfone (PES), polyether imide (PEI), and polyimide or a mixture or copolymer of two or more thereof.

Further, all the insulation heat radiation filler may be used without limitation as long as the insulation heat radiation filler has both insulation properties and heat radiation properties. As a specific example, the insulation heat radiation filler may include one or more selected from the group consisting of magnesium oxide, titanium dioxide, aluminum nitride, silicon nitride, boron nitride, aluminum oxide, silica, zinc oxide, barium titanate, strontium titanate, beryllium oxide, silicon carbide and manganese oxide.

In addition, the insulation heat radiation filler may be porous or non-porous and may be a core-shell type filler in which a widely known heat radiation filler such as a carbon-based material or a metal is used as a core and insulation components surround the core.

In the case of the insulation heat radiation filler, the surface thereof may be modified with a functional group such as a silane group, an amino group, an amine group, a hydroxyl group, or a carboxyl group, to improve wettability and the like so as to improve an interfacial bonding force with the polymer matrix.

However, it is noted that plastics having insulation properties and heat radiation properties used in the present invention are not limited thereto, and all plastics may be used without limitation as long as the plastics have both insulation properties and heat radiation properties.

Meanwhile, in the power semiconductor cooling module 100 for an electric vehicle according to one embodiment of the present invention, a heat transfer material 170 may be disposed between one surface of the heat reflux prevention member 160 and one surface of the cooling unit 150 in contact with each other.

The heat transfer material 170 may have thermal conductivity and may be interposed between the one surface of the heat reflux prevention member 160 and the one surface of the cooling unit 150 facing each other so that two surfaces of the heat transfer material 170 may be in surface contact with the one surface of the heat reflux prevention member 160 and the one surface of the cooling unit 150. As a result, the heat transfer material 170 may smoothly transfer the heat from the heat reflux prevention member 160 toward the cooling unit 150.

As an example, the heat transfer material 170 may be in the form of a pad obtained by solidifying a heat radiation forming composition including at least one of a heat conductive filler and a phase change material.

Further, the heat transfer material 170 may be in the form of a sheet obtained by directly applying, to the one surface of the heat reflux prevention member 160, a heat radiation forming composition including at least one of the phase change material and the heat conductive filler in a predetermined thickness and by being solidified.

Here, the heat transfer material 170 may be interposed between the one surface of the heat reflux prevention member 160 and the one surface of the cooling unit 150 facing each other and additionally between the one surface of the heat reflux prevention member 160 and a bottom surface of the case 111 facing each other as shown in FIG. 4.

Although the embodiments of the present invention have been described, the spirit of the present invention is not limited to the embodiments presented in the present specification. Those skilled in the art who understand the spirit of the present invention could easily propose other embodiments by adding, changing, deleting, adding, or the like of components within the same scope of the spirit. Further, these other embodiments also belong to the scope of the spirit of the present invention.

The invention claimed is:

1. A power semiconductor cooling module for an electric vehicle, which is electrically connected to a motor, comprising:
   a housing part formed in a box shape having an internal space;
   a power element part disposed in the internal space and electrically connected to the motor through a bus bar;
   a heat sink disposed in the internal space to be in contact with the power element part;
   a cooling unit configured to cool the heat sink; and
   a heat reflux prevention member disposed to surround the bus bar and disposed to be in contact with the cooling unit,
   wherein the bus bar includes a first end electrically connected to the power element part and a second end exposed outside of the housing part,
   wherein the heat reflux prevention member is disposed to be in contact with the cooling unit while surrounding a circumference of the bus bar between the first end and the second end so as to block the heat generated from the motor from being transferred to the power element part through the bus bar, and
   wherein the heat reflux prevention member is directly cooled by the cooling unit.

2. The power semiconductor cooling module of claim 1, wherein the heat sink includes a heat radiation plate formed in a plate shape having a predetermined area and a plurality of heat radiation fins protruding from one surface of the heat radiation plate.

3. The power semiconductor cooling module of claim 1, wherein the cooling unit includes an accommodation groove recessed from one surface of a body of the cooling unit by a predetermined depth so that the heat sink is accommodated therein, and
   an edge of the heat sink is in direct contact with the body while inserted into the accommodation groove.

4. The power semiconductor cooling module of claim 1, wherein the cooling unit includes a body in which a cooling water supplied from outside is accommodated therein, and an inlet and an outlet provided on one side of the body so that the cooling water is introduced or discharged through the inlet or the outlet, and
   the heat sink is cooled through heat exchange with the cooling water.

5. The power semiconductor cooling module of claim 1, wherein the heat reflux prevention member is disposed so that one surface thereof is in surface contact with one surface of the cooling unit.

6. The power semiconductor cooling module of claim 1, wherein the heat reflux prevention member is made of a plastic material having heat radiation properties and insulation properties.

7. The power semiconductor cooling module of claim 1, wherein a heat transfer material is interposed between one surface of the heat reflux prevention member and one surface of the cooling unit facing each other.

8. The power semiconductor cooling module of claim 1, wherein the heat reflux prevention member blocks heat from being moved from the first end toward the second end through heat exchange with the cooling unit.

\* \* \* \* \*